(12) United States Patent
Ganguli et al.

(10) Patent No.: US 10,930,550 B2
(45) Date of Patent: Feb. 23, 2021

(54) BARRIER FOR COPPER METALLIZATION AND METHODS OF FORMING

(71) Applicant: Applied Materials, Inc., Santa Clara, CA (US)

(72) Inventors: Seshadri Ganguli, Sunnyvale, CA (US); Sang Ho Yu, Cupertino, CA (US); Lu Chen, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/402,607

(22) Filed: May 3, 2019

(65) Prior Publication Data

US 2019/0341304 A1    Nov. 7, 2019

Related U.S. Application Data

(60) Provisional application No. 62/667,606, filed on May 6, 2018.

(51) Int. Cl.
| | |
|---|---|
| *H01L 21/786* | (2006.01) |
| *H01L 21/768* | (2006.01) |
| *H01L 21/02* | (2006.01) |
| *C23C 16/56* | (2006.01) |
| *C23C 16/455* | (2006.01) |
| *C23C 16/34* | (2006.01) |

(52) U.S. Cl.
CPC .. *H01L 21/76856* (2013.01); *H01L 21/02304* (2013.01); *H01L 21/02362* (2013.01); *H01L 21/76829* (2013.01); *C23C 16/34* (2013.01); *C23C 16/45553* (2013.01); *C23C 16/56* (2013.01)

(58) Field of Classification Search
CPC ............. H01L 21/02194; H01L 21/022; H01L 21/02362; H01L 21/28202; H01L 21/31604; H01L 21/318; H01L 21/76829; H01L 21/76855; H01L 21/76856; H01L 29/518
See application file for complete search history.

(56) References Cited

U.S. PATENT DOCUMENTS

| | | | |
|---|---|---|---|
| 7,335,990 B2 | 2/2008 | Li et al. | |
| 8,324,095 B2 | 12/2012 | Chung et al. | |
| 8,877,633 B2 | 11/2014 | Zhang et al. | |
| 9,679,810 B1 * | 6/2017 | Nag | H01L 21/76883 |

(Continued)

FOREIGN PATENT DOCUMENTS

| | | |
|---|---|---|
| KR | 20050118464 A | 12/2005 |
| KR | 100936490 B1 | 1/2010 |

OTHER PUBLICATIONS

Written Opinion of the International Searching Authority in PCT/US2019/030553, dated Aug. 16, 2019.

*Primary Examiner* — Caridad Everhart
(74) *Attorney, Agent, or Firm* — Servilla Whitney LLC

(57) ABSTRACT

Electronic devices and methods with a barrier layer and methods of forming the barrier layer are described. A substrate can be exposed to a metal precursor (e.g., a tantalum precursor), a reactant (e.g., ammonia) and an optional plasma to form a first thickness of the barrier layer. An optional aluminum film can be formed on the first barrier layer and a second barrier layer is formed on the first barrier layer to form barrier layer with an aluminum inter-layer.

18 Claims, 3 Drawing Sheets

(56) References Cited

U.S. PATENT DOCUMENTS

| | | | |
|---|---|---|---|
| 2003/0186539 A1 | 10/2003 | Lee et al. | |
| 2006/0178015 A1* | 8/2006 | Verhaverbeke | H01L 21/022 438/778 |
| 2007/0036894 A1 | 2/2007 | Thompson | |
| 2008/0274278 A1* | 11/2008 | Baumann | C23C 16/45523 427/250 |
| 2008/0284020 A1* | 11/2008 | Ishizaka | C23C 16/36 257/751 |
| 2011/0024908 A1 | 2/2011 | Lee et al. | |
| 2014/0291847 A1 | 10/2014 | Zhang et al. | |
| 2014/0327142 A1* | 11/2014 | Harrison | H01L 21/283 257/761 |
| 2015/0056385 A1* | 2/2015 | Ishizaka | H01J 37/3429 427/576 |
| 2017/0365555 A1 | 12/2017 | Choi et al. | |

\* cited by examiner

BARRIER FOR COPPER METALLIZATION AND METHODS OF FORMING

CROSS-REFERENCE TO RELATED APPLICATIONS

This application claims priority to U.S. Provisional Application No. 62/667,606, filed May 6, 2018, the entire disclosure of which is hereby incorporated by reference herein.

TECHNICAL FIELD

Embodiments of the disclosure relate to the barrier layers and methods of forming barrier layer. More particularly, embodiments of the disclosure are directed to conformal barrier layers for copper metallization and to methods of forming conformal barrier layers.

BACKGROUND

Semiconductor and electronics processing industries continue to strive for larger production yields while increasing the uniformity of layers deposited on substrates having larger surface areas. These same factors in combination with new materials also provide higher integration of circuits per area of the substrate. As circuit integration increases, the need for greater uniformity and process control regarding layer thickness rises. As a result, various technologies have been developed to deposit layers on substrates in a cost-effective manner, while maintaining control over the characteristics of the layer.

As smaller node devices are being created, the step coverage of current physical vapor deposition (PVD) barriers is insufficient and a conformal barrier is required. However, conformal barriers have high resistivity and the via resistance is higher than with PVD barriers. Current deposition processes use a process chamber solution to deposit a conformal film followed by PVD treatment in another processing chamber. This is a time-consuming and expensive process, requiring movement between and use of two processing chambers.

Therefore, there is a need in the art for barrier layers and methods for preparing barrier layers that allow higher throughput, lower via resistance and/or easier manufacturing processing.

SUMMARY

One or more embodiments of the disclosure are directed to methods of forming a barrier layer. A substrate surface is exposed to a tantalum precursor and a reactant to form a first tantalum nitride film having a first thickness. The tantalum nitride film is exposed to an aluminum precursor to form an aluminum film on the first tantalum nitride film. The substrate surface is exposed to the tantalum precursor and the reactant to form a second tantalum nitride film having a second thickness to form a barrier layer with an aluminum inter layer having a barrier layer thickness.

Additional embodiments of the disclosure are directed to processing methods comprising providing a substrate having a metal surface and a dielectric surface. A first TaN layer is selectively formed at a temperature by exposing the substrate to a tantalum precursor and a reactant to form an untreated TaN layer. The untreated TaN layer is exposed to a plasma to generate a first TaN layer. An aluminum film is formed on the first TaN layer by exposing the substrate to an aluminum precursor at about the same temperature as the first TaN layer. A second TaN layer is formed at the temperature by exposing the substrate to the tantalum precursor and the reactant to form an untreated TaN layer, and exposing the untreated TaN layer to a plasma to generate the second TaN layer.

Further embodiments of the disclosure are directed to semiconductor devices comprising a substrate with a first metal layer and a dielectric layer. A barrier layer comprising TaN with an aluminum inter-layer is formed on the dielectric layer. The aluminum inter-layer is discontinuous and the barrier layer comprising in the range of about 1 to about 3 at. % Al.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only a typical embodiment of the disclosure and are therefore not to be considered limiting of its scope, for the disclosure may admit to other equally effective embodiments.

DETAILED DESCRIPTION

Figure 1A:
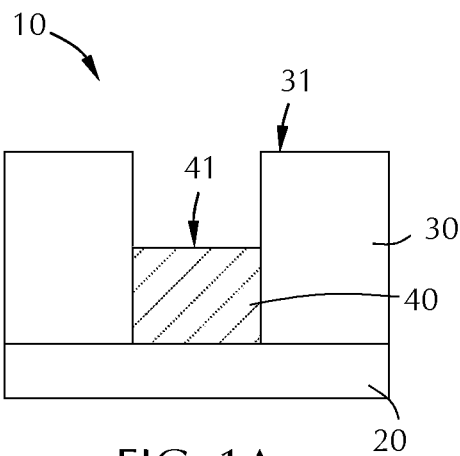
FIGS. 1A through 1E show a schematic representation of an electronic device formed in accordance with one or more embodiment of the disclosure.

Embodiments of the disclosure are directed to barrier layers and methods of making barrier layers. Some embodiments of the disclosure advantageously provide methods of making conformal barrier layers with via resistance equivalent to current PVD baseline methods. This may be achieved using a precursor which deposits selectively on oxide/metal oxide/carbide/nitride surfaces relative to pure metal surfaces. In some embodiments, aluminum is sandwiched between two layers of barrier film, advantageously improving barrier properties by gettering diffused metal (e.g. copper) atoms.

Some embodiments of the disclosure advantageously provide methods to deposit conformal films which via resistance equivalent to films deposited by a conventional physical vapor deposition process. Some embodiments advantageously provide methods of forming barrier layers which use one process chamber.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "reactive species", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed sequentially to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas sequentially.

In some embodiments of the disclosure, a barrier film is deposited by atomic layer deposition. For example, a film (~5 Å) is formed by alternating exposure to a tantalum precursor and a nitrogen reactant followed by treatment with a plasma (e.g., 40 MHz Ar/H2). The film formation process can be repeated to get a film with a predetermined thickness. In some embodiments, the plasma treatment reduces film resistivity. In some embodiments, the plasma treatment decreases carbon content of the film. In some embodiments, the plasma treatment improves barrier properties of the film.

Figure 1B:
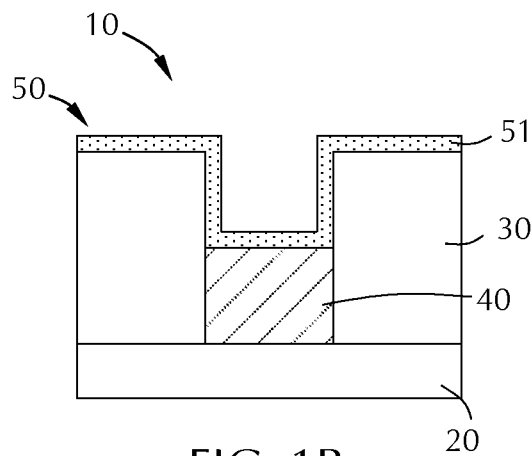
Figure 1C:
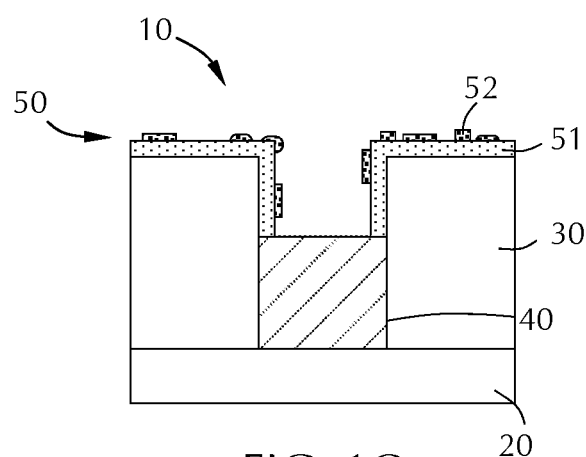
Figure 1D:
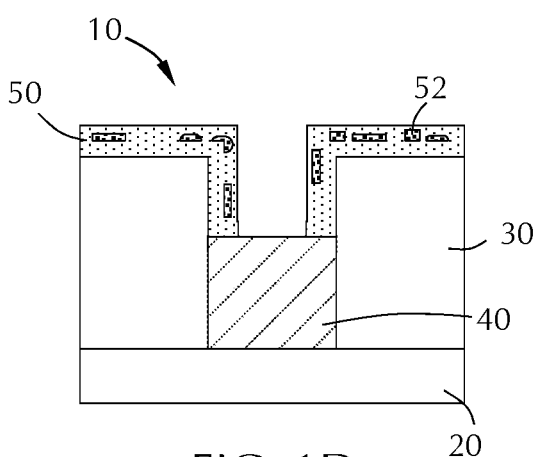
Figure 1E:
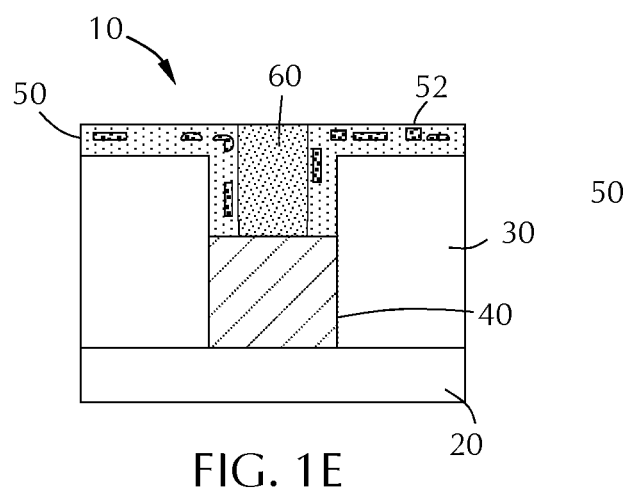
Figure 2:
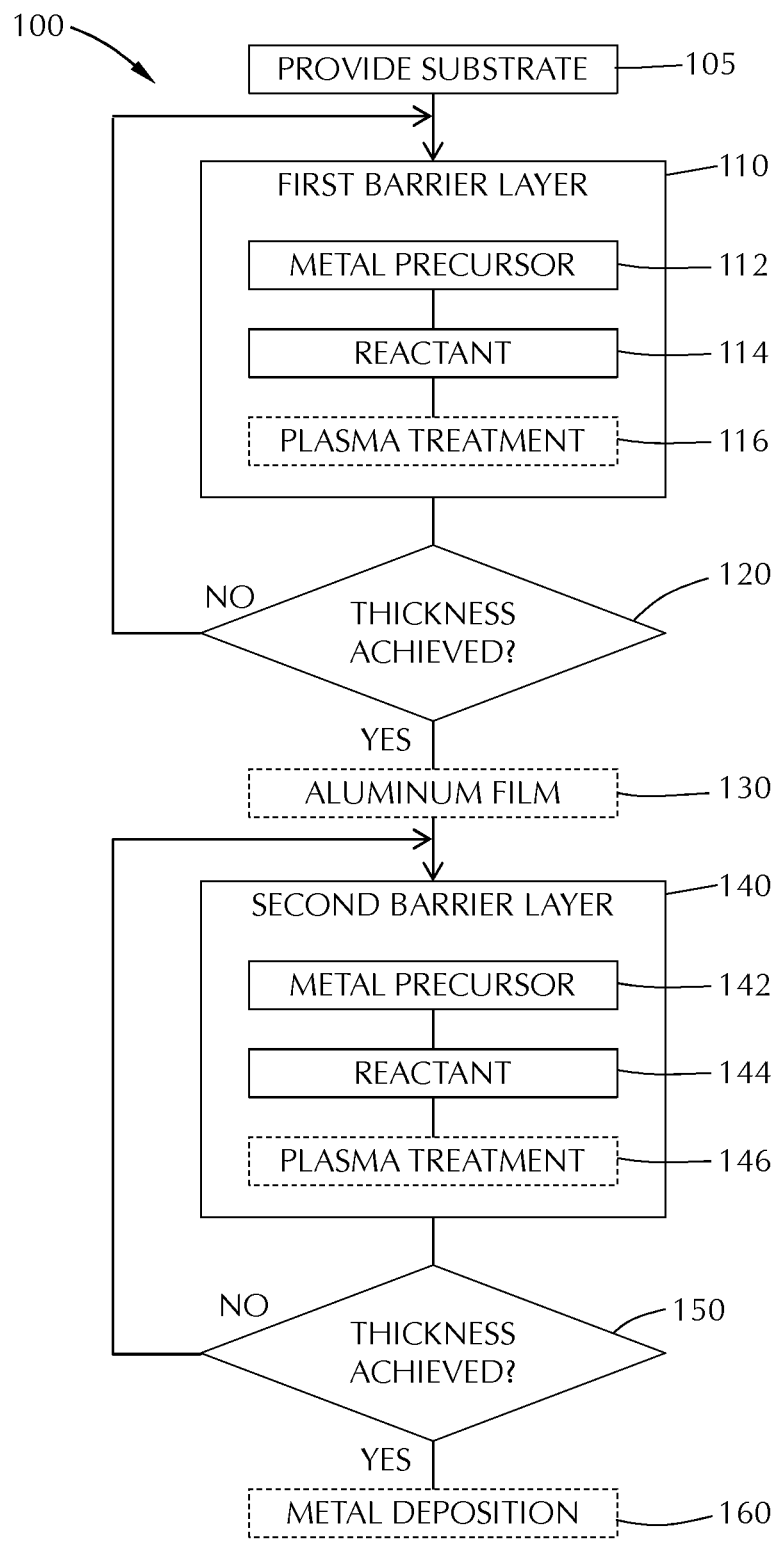
FIG. 2 illustrates a method of forming an electronic device in accordance with one or more embodiment of the disclosure.

FIGS. 1A to 1E illustrate an electronic device 10 processed in accordance with one or more embodiment of the method 100 described in FIG. 2. Referring to the Figures, one or more embodiment of the disclosure is directed to methods 100 of forming an electronic device 10. In some embodiments the method 100 is described as forming a barrier layer 50 on a substrate 20. At 105, a substrate 20 is provided for processing. As used in this manner, the term "provided for processing" means that the substrate placed into a position (I.e., processing chamber) to perform at least one method process, or process for formation of the substrate itself.

In some embodiments, the substrate 20 has a first material 30 with a first surface 31 and a second material 40 with a second surface 41. In some embodiments, the first material 30 comprises a dielectric (e.g., $SiO_2$). In some embodiments, the second material 40 comprises a conductive material (e.g., copper (Cu)). In some embodiments, the first material comprises a conductive material and the second material comprises a dielectric. In some embodiments, as illustrated in FIGS. 1A through 1E, the second material 40 is recessed below the level of the first material 30 so that the second surface 41 is below the first surface 31. Stated differently, in some embodiments, the first material 30 has a thickness greater than the second material 40, measured from the substrate 20. The staggered height of the first material and the second material forms at least one feature (e.g., a trench). The trench can have a bottom formed by the second surface 41 of the second material 40 and sidewalls formed by the first material 30.

As shown in FIG. 1B, formation of a barrier layer 50 begins by forming a first barrier layer 51. The first barrier layer 51 can be formed as a conformal film, as illustrated, or selectively on the first surface 31 of the first material 30 relative to the second surface 41 of the second material 40. As used in this specification and the appended claims, a "conformal" film has a substantially uniform thickness at the top, middle and bottom of a feature. A substantially uniform thickness does not vary by more than 10%, 5%, 2% or 1% relative to the average thickness.

The various embodiments of the disclosure are described herein with respect to the formation of a tantalum nitride (TaN) barrier layer 50. The skilled artisan will recognize that the disclosure is not limited to TaN barrier layers and that other materials are within the scope of the disclosure. In one or more embodiments, as shown at 110, a first barrier layer 51 is selectively formed at a temperature by exposing the substrate to a metal precursor 112 (e.g., a tantalum precursor) and a reactant 114 to form an untreated first barrier layer. The metal precursor and reactant can be exposed to the substrate at the same time or sequentially. In some embodiments, the untreated barrier layer is exposed to an optional plasma treatment 116 to generate the first barrier layer 51.

The metal precursor can be any suitable metal precursor known to the skilled artisan that can form a barrier layer. In some embodiments, the metal precursor comprises a tantalum precursor. In some embodiments, the tantalum precursor comprises a compound with the general formula M(NR$_2$)$_3$L, see structure (I),

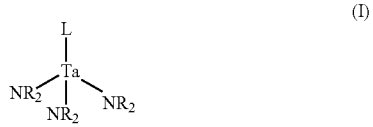
(I)

where M comprises a metal atom, each R is independently selected from the group consisting of H and C1-C5 alkyl, and L is an organic ligand with at least three carbon atoms and a double or triple bond that eta (η) bonds with the metal atom. As used in this manner, an eta (η) bond refers to a ligand that coordinates to the metal atom through at least two contiguous atoms.

In some embodiments, the metal atom (M) comprises, consists essentially of or consists of tantalum. In some embodiments, the term "consists essentially of" means that greater than or equal to about 95%, 98%, 99% or 99.5% of the metal atoms are the stated species, on an atomic basis.

In some embodiments, the ligand L coordinates to the metal atom via an η$^2$ bond in which two contiguous atoms coordinate to the metal atom. In some embodiments, the ligand L comprises in the range of about 3 to about 18 carbon atoms. In some embodiments, the ligand L comprises greater than or equal to three carbon atoms with a double bond. In some embodiments, the ligand L comprises greater than or equal to three carbon atoms with a triple bond. In some embodiments, the ligand L comprises at least one double and/or triple bond to non-terminal atom. As used in this manner, a non-terminal atom means any atom that forms the end of a chain of atoms, excluding hydrogen atoms. For example, a butylene with a double bond between the second and third carbon atoms is non-terminal, where a bond between the first and second carbon atom is a terminal bond. In some embodiments, the ligand L has a lower bond energy than each of the NR$_2$ groups. In some embodiments, the ligand L comprises one or more of butene, butyne, pentene, pentyne, hexane, hexyne, heptane, heptyne, octene, octyne, nonene, nonyne, decene or decyne.

In some embodiments, the ligand L bonds to the metal surface to inhibit deposition on the metal surface, increasing the selectivity of the deposition process on the dielectric surface. The plasma treatment can remove any ligand L that bonds to the metal surface so that there is little or no nucleation delay for the next precursor exposure.

The reactant 114 can be any suitable reactant that can react with the metal precursor adsorbed onto the substrate. Suitable reactants include, but are not limited to, nitrogen, ammonia, hydrazine, nitric oxide, nitrous oxide, combinations or plasmas thereof. In some embodiments, the reactant comprises, consists essentially of or consists of ammonia. Diluent, carrier or inert gases are not included in the calculation of composition of the reactant. In some embodiments, the reactant is exposed to the substrate in a thermal process—without plasma.

After reaction with the reactant, the substrate can be exposed to an optional plasma 116. The plasma exposure can change a property of the first barrier layer 51, remove residual ligand from metal surfaces and/or activate the surface for further deposition. In some embodiments, the plasma comprises a noble gas and hydrogen (H$_2$). The plasma of some embodiments comprises a hydrogen content in the range of about 10% to about 90%. In some embodiments, the noble gas comprises one or more of helium (He), neon (Ne), argon (Ar), krypton (Kr) or xenon (Xe). In some embodiments, the noble gas comprises, consists essentially of or consists of argon. In some embodiments, the plasma comprises argon and hydrogen with an Ar:H$_2$ ratio in the range of about 1:1 to about 1:10, or in the range of about 1:2 to about 1:8, or in the range of about 1:3 to about 1:5. In some embodiments, the plasma comprises greater than or equal to about 50%, 55%, 60%, 65%, 70%, 75%, 80% or 85% hydrogen, on a molar basis. In some embodiments, the plasma comprises less than or equal to about 90%, 85%, 80%, 75% or 70% hydrogen, on a molar basis.

In some embodiments, the plasma treatment can occur after each successive exposure to the metal precursor and the reactant. In some embodiments, the plasma treatment occurs after a metal nitride film of a predetermined thickness has been formed. For example, the plasma treatment can occur after every formation of 4-5 Å of TaN.

The deposition of the first barrier layer 51 can occur at any suitable temperature. In some embodiments, the deposition temperature is in the range of about 100° C. to about 500° C., or in the range of about 200° C. to about 400° C., or in the range of about 300° C. to about 350° C.

After each cycle of exposure to the metal precursor, reactant and optional plasma, the method reaches decision point 120. If the first barrier layer 51 has been formed to a predetermined thickness, the method moves on from the first barrier layer 110 deposition. If the first barrier layer 51 has not reached a predetermined thickness, the first barrier layer 110 deposition repeats.

After passing decision point 120, an optional aluminum film 52 is formed on the first barrier film 51, as shown in FIG. 1C. The aluminum film 52 can be formed by any suitable process known to the skilled artisan. In some embodiments, the aluminum film 52 is formed selectively on the first barrier layer 51. The aluminum film of some embodiments is formed by exposing the substrate to an aluminum precursor at about the same temperature as the first barrier layer 51 formation. The aluminum precursor of some embodiments comprises, consists essentially of or consists of tris(t-butyl)aluminum. In some embodiments, the aluminum inter-layer is formed by thermal decomposition of a suitable aluminum precursor.

In some embodiments, the aluminum film 52 is deposited to a thickness so that the aluminum film 52 is not continuous. Stated differently, the aluminum film 52 can be discontinuous. As used in this manner, the term "not continuous" or "discontinuous" means that the aluminum film 52 has regions of the first barrier layer 51 exposed so that less than or equal to about 90% 80%, 70%, 60%, 50%, 40%, 30%, 20% or 10% of the surface area of the first barrier layer has aluminum film formed thereon. In some embodiments, the aluminum film has a carbon content less than or equal to about 5%, 4%, 3% or 2%, on an atomic basis.

After formation of the aluminum film 52, the method 100 moves to a second barrier layer 140 formation process. As shown in FIG. 1D, a second barrier layer is formed on the first barrier layer 51 and the aluminum film 52 at about the same temperature as the first barrier layer 51 and the aluminum film 52. Formation of the second barrier layer can be done by the same process as the first barrier layer 51, or by a different process. In some embodiments, the first barrier layer and the second barrier layer are formed by exposing the substrate to the tantalum precursor of structure (I).

Figure 3:
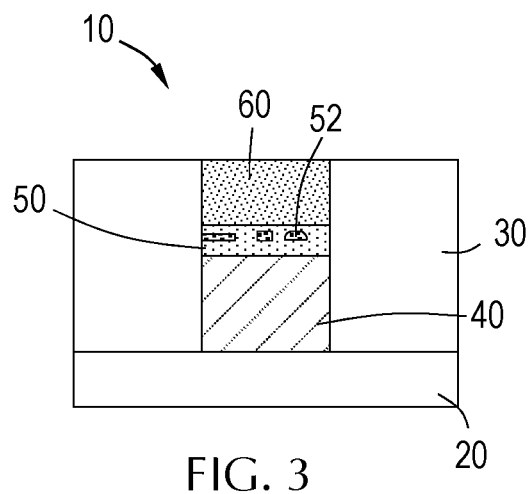
FIG. 3 illustrates a schematic representation of an electronic device formed in accordance with one or more embodiment of the disclosure.

In some embodiments, the first barrier layer 51 is selectively formed on the second material 40 relative to the first material 30. FIG. 3 illustrates an embodiment in which the barrier layer 50 is selectively formed on the second material 40.

Figure 4:
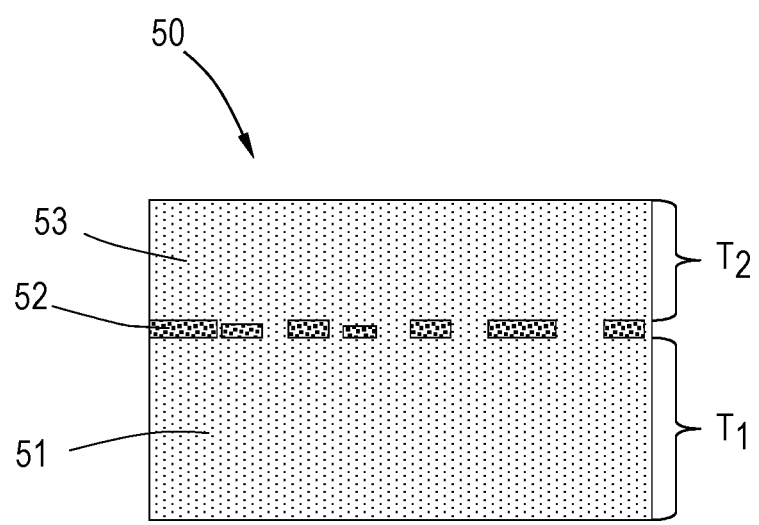
FIG. 4 illustrates a barrier layer with aluminum inter-layer in accordance with one or more embodiment of the disclosure.

FIG. 4 illustrates a barrier layer 50 with an aluminum 52 inter-layer. The barrier layer 50 shown comprises a first barrier layer 51, an aluminum film 52 and as second barrier layer 53. The first barrier layer 51 is formed to a thickness $T_1$ and the second barrier layer 53 is formed to a thickness $T_2$. In some embodiments, the first thickness $T_1$ is greater than or equal to the second thickness $T_2$. In some embodiments, the first thickness is in the range of about 5 Å to about 15 Å, or in the range of about 6 Å to about 14 Å, or in the range of about 7 Å to about 13 Å, or in the range of about 8 Å to about 12 Å, or in the range of about 9 Å to about 11 Å, or in the range of about 9 Å to about 10 Å. In some embodiments, the second thickness $T_2$ is in the range of about 2 Å to about 10 Å, or in the range of about 3 Å to about 8 Å, or in the range of about 4 Å to about 5 Å. In some embodiments, a ratio of the first thickness $T_1$ to second thickness $T_2$ is in the range of about 1:1 to about 10:1, or in the range of about 2:1 to about 7:1. In some embodiments, the total thickness of the barrier layer 50, including the aluminum film 52, is in the range of about 10 Å to about 30 Å, or in the range of about 12 Å to about 25 Å, or in the range of about 15 Å to about 20 Å. In some embodiments, the barrier layer 50 has a thickness of about 20 Å made up of a first barrier layer 51 of about 10 Å, an aluminum inter-layer and a second barrier layer 53 of about 10 Å. Because the aluminum inter-layer is discontinuous, the thickness contributed by this layer is not counted as the gaps in the film will be filled with the second barrier layer. In some embodiments, the barrier layer has a thickness of about 15 Å made up of about 9-10 Å of the first barrier layer, an aluminum inter-layer, and about 5-6 Å of a second barrier layer.

In some embodiments, the barrier layer 50 comprises tantalum nitride with an aluminum content. In some embodiments, the aluminum content is in the range of about 0.5% to about 10%, or in the range of about 1% to about 5%, or in the range of about 1% to about 3%, on an atomic basis.

In some embodiments, the method comprises exposing a substrate surface to a tantalum precursor and a reactant to form a first tantalum nitride film having a first thickness. The first tantalum nitride film is then exposed to an aluminum precursor to form an aluminum film on the first tantalum nitride film. The substrate surface is then exposed to the tantalum precursor and the reactant to form a second tantalum nitride film having a second thickness to form a barrier layer with an aluminum inter layer having a barrier layer thickness.

Referring back to FIGS. 1E and 2, after formation of the barrier layer 50, the method 100 optionally proceeds to a metal deposition 160 process. In some embodiments, the second material 40 is a conductive material and a metal layer 60 (e.g. cobalt) is deposited on the second material 40.

Samples of TaN barrier layers were prepared and the via resistance (~32 nm) was compared. The comparative example was deposited by a convention physical vapor deposition process to a thickness of about 40 Å. This comparative sample had a via resistance of 8.09 ohms. TaN films formed to a thickness of about 20 Å at a temperature of about 325° C. with a tantalum precursor with an eta bonded ligand (9.15 ohms) or pentakis(dimethylamino)tantalum (PDMAT) (37.16 ohms).

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a barrier layer, the method comprising:
    exposing a substrate surface to a tantalum precursor and a reactant to form a first tantalum nitride film having a first thickness;
    exposing the tantalum nitride film to an aluminum precursor to form an aluminum film on the first tantalum nitride film; and
    exposing the substrate surface to the tantalum precursor and the reactant to form a second tantalum nitride film having a second thickness to form a barrier layer with an aluminum inter layer having a barrier layer thickness, the barrier layer having an aluminum content in the range of about 1% to about 3%, on an atomic basis.

2. The method of claim 1, wherein the tantalum precursor comprises a compound with the general formula $M(NR_2)_3L$, where M comprises tantalum, each R is independently selected from the group consisting of H and C1-C5 alkyl, and L is an organic ligand with at least three carbon atoms and a double or triple bond that eta bonds with M.

3. The method of claim 2, wherein L has a lower bond energy than each of the —$NR_2$ groups.

4. The method of claim 1, wherein the reactant comprises ammonia.

5. The method of claim 4, wherein the reactant is not a plasma.

6. The method of claim 1, the first thickness is in the range of about 7 Å to about 11 Å.

7. The method of claim 6, wherein the second thickness is in the range of about 3 Å to about 6 Å.

8. The method of claim 1, wherein the barrier layer thickness is in the range of about 10 Å to about 30 Å.

9. The method of claim 8, wherein the aluminum film is not continuous.

10. The method of claim 8, wherein the aluminum film has a carbon content less than or equal to about 5%, on an atomic basis.

11. The method of claim 1, wherein forming the first tantalum nitride film and the second tantalum nitride film comprises sequential exposure of the substrate to the tantalum precursor and the reactant to form a film with a thickness in the range of about 3.5 Å to about 6 Å and then treating the film with a plasma comprising a noble gas and hydrogen ($H_2$), the plasma having a hydrogen content in the range of about 10% to about 90%.

12. The method of claim 11, wherein the noble gas comprises argon with an Ar:$H_2$ ratio in the range of about 1:1 to about 1:10.

13. The method of claim 2, wherein the substrate surface comprises a metal surface and a dielectric surface and the barrier layer is selectively formed on the dielectric surface.

14. The method of claim 13, wherein the ligand L bonds to the metal surface, inhibiting deposition on the metal surface.

15. A processing method comprising:
    providing a substrate having a metal surface and a dielectric surface;

selectively forming a first thickness of a first TaN layer at a temperature by exposing the substrate to a tantalum precursor and a reactant to form an untreated TaN layer, and exposing the untreated TaN layer to a plasma to generate a first TaN layer;

forming an aluminum film on the first TaN layer by exposing the substrate to an aluminum precursor at about the same temperature as the first TaN layer; and selectively forming a second thickness of a second TaN layer at the temperature by exposing the substrate to the tantalum precursor and the reactant to form an untreated TaN layer, and exposing the untreated TaN layer to a plasma to generate the second TaN layer, the first TaN layer, the aluminum film and the second TaN layer forming a barrier layer with an aluminum inter layer having a barrier layer thickness.

16. The method of claim 15, wherein the tantalum precursor comprises a compound with the general formula $M(NR_2)_3L$, where M comprises tantalum, each R is independently selected from the group consisting of H and C1-C5 alkyl, and L is an organic ligand with at least three carbon atoms and a double or triple bond that eta bonds with M and L has a lower bond energy than each of the —$NR_2$ groups the reactant comprises ammonia and forming the TaN layer occurs in a thermal atomic layer deposition process.

17. The method of claim 15, wherein the first thickness is in the range of about 7 Å to about 11 Å, the second thickness is in the range of about 3 Å to about 6 Å, the barrier layer has an aluminum content in the range of about 1% to about 3%, on an atomic basis.

18. The method of claim 15, wherein the aluminum film is not continuous and has a carbon content less than or equal to about 5%, on an atomic basis.

* * * * *